(12) United States Patent
Bosman et al.

(10) Patent No.: US 10,128,392 B2
(45) Date of Patent: Nov. 13, 2018

(54) METHOD FOR MANUFACTURING A THIN FILM SOLAR CELL ARRANGEMENT AND SUCH A THIN FILM SOLAR CELL ARRANGEMENT

(71) Applicant: Stichting Energieonderzoek Centrum Nederland, Petten (NL)

(72) Inventors: Johan Bosman, Petten (NL); Tristram Budel, Petten (NL)

(73) Assignee: Stichting Energieonderzoek Centrum Nederland, Petten (NL)

( * ) Notice: Subject to any disclaimer, the term of this patent is extended or adjusted under 35 U.S.C. 154(b) by 0 days.

(21) Appl. No.: 15/535,097

(22) PCT Filed: Dec. 17, 2015

(86) PCT No.: PCT/EP2015/080318
§ 371 (c)(1),
(2) Date: Jun. 12, 2017

(87) PCT Pub. No.: WO2016/102326
PCT Pub. Date: Jun. 30, 2016

(65) Prior Publication Data
US 2017/0373208 A1    Dec. 28, 2017

(30) Foreign Application Priority Data
Dec. 23, 2014 (NL) ..................................... 2014041

(51) Int. Cl.
*H01L 31/0224* (2006.01)
*H01L 31/0463* (2014.01)
(Continued)

(52) U.S. Cl.
CPC .... *H01L 31/0463* (2014.12); *H01L 31/02167* (2013.01); *H01L 31/022433* (2013.01);
(Continued)

(58) Field of Classification Search
CPC ................... H01L 31/0465; H01L 31/022433
See application file for complete search history.

(56) References Cited

U.S. PATENT DOCUMENTS

2005/0070107 A1   3/2005   Shinohara
2008/0314439 A1   12/2008  Misra
(Continued)

FOREIGN PATENT DOCUMENTS

JP   2004260013 A   9/2004
KR   20130047513 A  5/2013

*Primary Examiner* — Thomas L Dickey
(74) *Attorney, Agent, or Firm* — N.V. Nederlandsch Octrooibureau; Catherine A. Shultz; Tamara C. Stegmann (57) ABSTRACT

Solar cell arrangement of a thin film solar cell array on a substrate; each solar cell being layered with a bottom electrode, a photovoltaic active layer, a top electrode and an insulating layer. A first trench and a second trench parallel to the first trench at a first side, separate a first solar cell and an adjacent second solar cell. The first and second trenches are filled with insulating material. The first trench extends to the substrate. The second trench extends into the photovoltaic active layer below the top electrode. A third trench extending to the bottom electrode is between the first and second trench. A fourth trench extending to the top electrode is at a second side of the first trench. The third and fourth trench are filled with conductive material. A conductive bridge connects the third trench and the fourth trench across the first trench.

20 Claims, 4 Drawing Sheets

(51) Int. Cl.
  *H01L 31/0216*  (2014.01)
  *H01L 31/20*  (2006.01)
  *H01L 31/0465*  (2014.01)
  *H01L 31/0392*  (2006.01)
  *H01L 31/18*  (2006.01)

(52) U.S. Cl.
  CPC ...... *H01L 31/0392* (2013.01); *H01L 31/0465* (2014.12); *H01L 31/1896* (2013.01); *H01L 31/206* (2013.01); *Y02E 10/50* (2013.01); *Y02P 70/521* (2015.11)

(56) References Cited

U.S. PATENT DOCUMENTS

| | | | |
|---|---|---|---|
| 2011/0174376 A1* | 7/2011 | Lochtefeld ...... | H01L 31/022425 136/261 |
| 2012/0234366 A1* | 9/2012 | Lambertz ............ | H01L 31/0463 136/244 |

* cited by examiner

METHOD FOR MANUFACTURING A THIN FILM SOLAR CELL ARRANGEMENT AND SUCH A THIN FILM SOLAR CELL ARRANGEMENT

FIELD OF THE INVENTION

The present invention relates to a method for manufacturing a thin film solar cell arrangement. Also, the invention relates to a thin film solar cell arrangement.

BACKGROUND

From US 2008 0314439 a process for manufacturing thin film solar cell panels is known. The process of forming an array of monolithically integrated thin film photovoltaic cells from a stack of thin film layers formed on an insulating substrate includes forming at least one cell isolation scribe in the stack of thin film layers. A second electrical contact layer isolation scribe is formed for each cell isolation scribe adjacent to a respective cell isolation scribe. A via scribe is formed in the stack of thin film layers between each cell isolation scribe and its respective second electrical contact layer isolation scribe. Insulating ink is disposed in each cell isolation scribe, and conductive ink is disposed in each via scribe to form a via. Conductive ink is also disposed along the top surface of the stack of thin film layers to form at least one conductive grid.

The application of the insulating ink and the conductive ink in the respective scribes in a pattern that is substantially defined by the inkjet line dimensions, causes that a portion of the area of the photovoltaic cells is shaded and becomes a dead zone which reduces the efficiency of the photovoltaic cells. Additionally, the alignment of the via scribe with respect to the isolation scribes and of the conductive ink area disposed to form the via between adjacent cells must be sufficiently accurate to obtain a contact of the adjacent cells.

SUMMARY OF THE INVENTION

It is an object of the invention to overcome one or more of the disadvantages from the prior art.

The object is achieved by a method for manufacturing a thin film solar cell arrangement with an array of thin film solar cells, comprising providing a substrate; creating a layer stack on a surface of the substrate, the layer stack comprising a bottom electrode layer, a photovoltaic active layer, and a top electrode layer, with the bottom electrode layer arranged on the surface of the substrate, the photovoltaic active layer arranged on the bottom electrode layer, the top electrode layer arranged on the photovoltaic active layer, and creating an insulating layer arranged on the top electrode layer; creating a first trench in the insulating layer and the layer stack that extends to the surface of the substrate; creating at a first side of the first trench, a second trench in the insulating layer and the layer stack which second trench extends into the photovoltaic active layer below the top electrode layer; the second trench being spaced apart from the first trench at a first distance in a first direction; filling the first and second trenches with an insulating material; creating a third trench in the insulating layer and the layer stack located between the first filled trench and the second filled trench, the third trench extending into the bottom electrode layer, in a manner that the bottom electrode layer is exposed; creating a fourth trench at second side, opposite to the first side, of the first trench, the fourth trench extending through the insulating layer into the top electrode layer, in a manner that the top electrode layer is exposed; filling the third and fourth trenches with a conductive material, and creating on top of the insulating layer a bridge element of conductive material between a top of the third filled trench and a top of the fourth filled trench, the bridge element crossing the first filled trench.

The invention comprises that the backend interconnection is made through the combination of additive and subtractive processes that create the serial interconnection of adjacent thin film solar cells as one step. To improve the alignment and achieve at the same time a significant reduction in non-photovoltaic active area (dead zone) the processes are combined in an optimized order. The interconnection can be separated into two conditions. First the isolation of the back electrode from the series connection and the connection itself.

By creating an insulating layer of the photovoltaic layer stack (the top electrode, the photovoltaic active layer and the bottom electrode) and by adding the scribe for the fourth trench through the insulating layer, the additive method of inkjet printing is used together with the subtractive method of laser ablation in such a way that both methods can be integrated with a lower accuracy (production yield improvement) and smaller dead zones (module quality improvement).

The structure of the four scribed trenches according to the invention, is easier to print because the conductive connection is defined by the position of the third trench and the fourth trench and not by the inkjet line dimensions. As long as the inkjet line covers both the third trench and the fourth trench there will be an interconnection between the adjacent thin film solar cells.

According to an aspect of the invention the object is achieved by a method for manufacturing a thin film solar cell panel, comprising: providing a substrate; creating a layer stack on a surface of the substrate, the layer stack comprising a bottom electrode layer, a photovoltaic active layer and a top electrode layer, with the bottom electrode layer arranged on the surface of the substrate, the photovoltaic active layer arranged on the bottom electrode layer, and the top electrode layer arranged on the photovoltaic active layer; creating a first trench in the layer stack that extends to the surface of the substrate; creating at a first side of the first trench, a second trench in the layer stack which extends into the photovoltaic active layer below the top electrode layer; the second trench being spaced apart from the first trench at a first distance in a first direction; creating a local insulating layer above the first and second trenches in a manner that the first and second trenches are filled by the material of the insulating layer and that the local insulating layer covers the first and second filled trenches and extends laterally along a portion of the top electrode layer in at least the first and the second direction; creating a third trench through the local insulating layer and the layer stack located between the first filled trench and the second filled trench, the third trench extending to the bottom electrode layer, in a manner that the bottom electrode layer is exposed; creating a fourth trench through the local insulating layer at a second side, opposite to the first side, of the first trench, the fourth trench extending to the top electrode layer, in a manner that the top electrode layer is exposed; filling the third and fourth trenches with a conductive material, and creating on the local insulating layer a bridge element of conductive material between a top of the third filled trench and a top of the fourth filled trench, the bridge element crossing the first filled trench.

According to this alternative method according to the invention, the insulating layer is created during the formation of the insulation in the first and second trenches as a local capping layer that covers the filled first and second trenches and extends over a portion of each of the two thin film solar cells that are interconnected in accordance with the method.

According to an aspect, the invention relates to a method as described above, wherein the creation of a first, second, third or fourth trench is performed by ablative laser scribing.

According to an aspect, the invention relates to a method as described above, wherein filling the first and second trenches with insulating material comprises printing an ink comprising the insulating material at the location of the first and second trenches and subsequently curing the printed ink.

According to an aspect, the invention relates to a method as described above, wherein the creation of the local insulating layer comprises printing an ink comprising insulating material in the form of such a local insulating layer and subsequently curing the printed ink.

According to an aspect, the invention relates to a method as described above, wherein the creation of the local insulating layer comprises the step of filling the first and second trenches with insulating material.

According to an aspect, the invention relates to a method as described above, wherein the created insulating layer or the created local insulating layer is substantially continuous and uninterrupted.

According to an aspect, the invention relates to a method as described above, wherein the filling of the third and fourth trenches comprises one filling step selected from: printing an ink comprising conductive material, slot dyeing a dye comprising conductive material and spraying an ink comprising conductive material, said selected filling step followed by a curing of the ink or dye.

According to an aspect, the invention relates to a method as described above, wherein the creation of the bridge element comprises one creation step selected from: printing an ink comprising conductive material, slot dyeing a dye comprising conductive material and spraying an ink comprising conductive material, said selected creation step followed by a curing of the ink or dye.

According to an aspect, the invention relates to a method as described above, wherein the manufacturing is carried out in a roll-to-roll process.

According to an aspect, the invention relates to a method as described above, wherein the creation of the insulating layer is done by a deposition process or formation process configured for creation of a continuous and uninterrupted insulator layer.

This layer can be applied for example by inkjet printing, atomic layer deposition, dispensing, printing, coating or the application of a laminating foil, or by another technique known in the art.

According to an aspect, the invention relates to a method as described above, wherein the creation of the first trench and the second trench is done by a pair of parallel laser beam scribes.

According to an aspect, the invention relates to a method as described above, wherein the creation of the third trench and the fourth trench is done by a second pair of parallel laser beam scribes.

According to an aspect, the invention relates to a method as described above, wherein the fourth trench is configured to have a digitated structure with digits extending over the isolating layer or the local isolating structure away from the position of the first isolating body, and filling the digitated fourth trench to obtain a digitated second conductive body structure.

According to an aspect, the invention relates to a method as described above, wherein the bridge element has a digitated structure similar to the digitated structure of the fourth trenches or the second conductive body structure.

The invention also relates to a thin film solar cell arrangement comprising a substrate and an array of thin film solar cells arranged on said substrate; each thin film solar cell being a layered stack structure comprising a bottom electrode layer, a photovoltaic active layer, a top electrode layer and an insulating layer, with the bottom electrode layer arranged on the surface of the substrate, the photovoltaic active layer arranged on the bottom electrode layer, the top electrode layer arranged on the photovoltaic active layer, and the insulating layer arranged on the top electrode layer, wherein a first thin film solar cell and a second thin film solar cell adjacent to the first thin film solar cell in a first direction are separated by a first trench and a second trench; the second trench being parallel to the first trench at a first side of the first trench and at a first distance from the first trench; the first trench extending in the layered stack to the surface of the substrate and filled with an insulating material; the second trench extending in the layer stack into the photovoltaic active layer below the top electrode layer and filled with insulating material; a third trench being located between the first and second trench and extending in the layered stack to the bottom electrode layer, in a manner that the bottom electrode layer is exposed, the third trench being filled with conductive material; a fourth trench being located at a second side of the first trench, opposite to the first side and extending through the insulating layer to the top electrode layer in a manner that the top electrode layer is exposed, the fourth trench being filled with conductive material, and a bridging element of conductive material between a top of the third filled trench and a top of the fourth filled trench, the bridge element crossing the first filled trench.

According to an aspect, the invention relates to a thin film solar cell arrangement as described above, wherein the insulating layer is a local insulating layer that covers the first and second trenches and extends laterally along a portion of the top electrode layer in at least the first and a second direction opposite to the first direction.

According to an aspect, the invention relates to a thin film solar cell arrangement as described above, wherein the substrate is selected from a group comprising a thermoplastic foil, a Polyethylene terephthalate, PET, foil or plate, a Polyethylene naphthalate, PEN, foil or plate, a glass substrate, a metal substrate with a insulated surface layer, and a ceramic substrate.

According to an aspect, the invention relates to a thin film solar cell arrangement as described above, wherein the photovoltaic active layer is selected from a group comprising thin film silicon, Copper indium gallium (di)selenide CIGS, Cadmium telluride CdTe, Organic PhotoVoltaic material OPV, and a Perovskite.

According to an aspect, the invention relates to a thin film solar cell arrangement as described above, wherein at least one of the top electrode and the bottom electrode comprises a transparent conductive oxide.

According to an aspect, the invention relates to a thin film solar cell arrangement as described above, wherein a thickness of the transparent conductive oxide of the at least one of the top electrode and bottom electrode is about 1 μm.

According to an aspect, the invention relates to a thin film solar cell arrangement as described above, wherein a thickness of the insulating layer or local insulating layer in the layered stack structure is between about 100 nm and about 4 μm.

According to an aspect, the invention relates to a thin film solar cell arrangement as described above, wherein the filled fourth trench has a digitated structure with digits extending over the isolating layer or the local isolating structure away from the position of the first isolating trench, and the bridge element has a digitated structure covering the digitated structure of the filled fourth trenches.

BRIEF DESCRIPTION OF THE DRAWINGS

The invention will be explained in more detail below with reference to drawings in which illustrative embodiments of the invention are shown. It will be appreciated by the person skilled in the art that other alternative and equivalent embodiments of the invention can be conceived and reduced to practice without departing from the true spirit of the invention, the scope of the invention being limited only by the appended claims.

DESCRIPTION OF EMBODIMENTS

Figure 1:
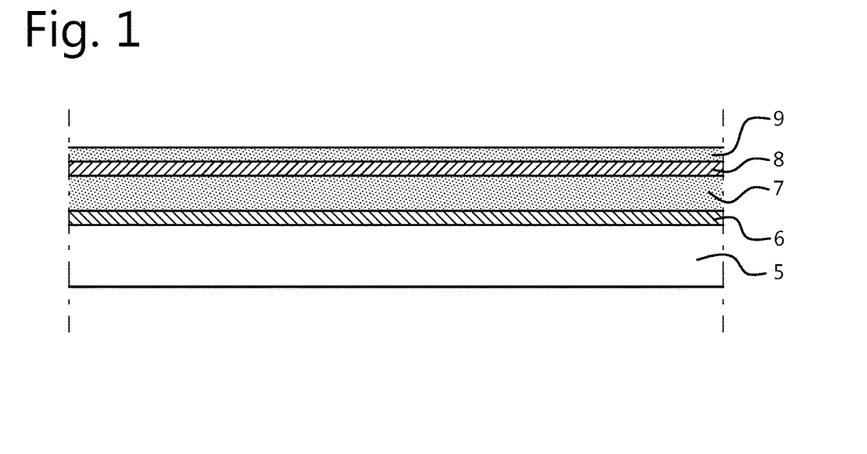
FIG. 1 shows a cross-section of a layer stack on a substrate in a step of a process for forming a thin film solar panel according to an embodiment of the invention.

FIG. 1 shows a cross-section of a layer stack on a substrate in a step of a process for forming a thin film solar cell arrangement according to an embodiment of the invention.

On a substrate 5, a stack of layers 6, 7, 8, 9 is fabricated by deposition of the individual layers in a sequence.

On the substrate 5, first a bottom electrode layer 6 is created, by a suitable deposition or coating process.

Next on the bottom electrode layer 6, a photoactive layer 7 is formed. The photoactive layer 7 is covered by a top electrode layer 8.

The bottom electrode layer 6, the photo-active layer 7 and the top electrode layer 8 form a layer stack which is capable of producing electrical energy under radiation from a source such as the Sun, this arrangement of layers 6, 7, 8 is further referred to as active layer stack 6, 7, 8.

On the top electrode layer 8 is an insulating layer 9 formed. In an embodiment, the insulating layer as fabricated is continuous and uninterrupted. Preferably, the insulating layer 9 is substantially free of pin holes.

In addition, the insulating layer 9 should be as thin as possible and be adhesive to the top electrode layer 8.

From the components of the active layer stack 6, 7, 8 and the insulating layer 9 at least the insulating layer 9 and the top electrode layer 8 are (semi-) transparent to allow incident light to pass these layer and reach the photoactive layer 7.

In an embodiment, the substrate 5 and bottom electrode layer 6 are also (semi) transparent.

The substrate 5 may be a flexible layer such as a foil. Alternatively, the substrate 5 may be a rigid plate such a glass panel.

Figure 2:
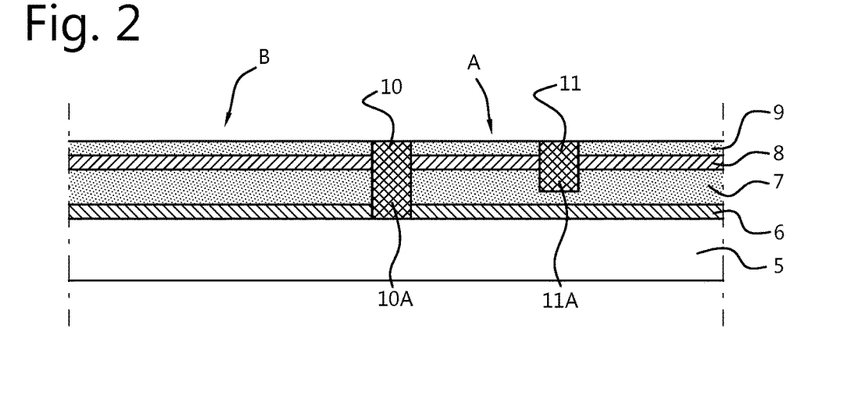
FIG. 2 shows a cross-section of the layer stack on a substrate according to a further step of the process.

FIG. 2 shows a cross-section of the layer stack on a substrate according to a further step of the process.

In the further step, a pattern of first and second isolation bodies 10, 11 are created in the active layer stack 6, 7, 8 and the insulating layer 9.

The isolation bodies 10, 11 are typically formed by selective laser ablation process (also known as laser scribing process) in which a pattern of first and second trenches (scribes) are formed in the active layer stack, followed by a deposition process of the isolating bodies 10, 11 in the first and second trenches.

The first and second trenches are patterned in accordance with the contours of the photovoltaic cells are to be formed in the layer stack.

A first trench 10A is formed to have a depth in the insulating layer 9 and the layer stack 6, 7, 8 that extends to the surface of the substrate 5. In this manner the first trench 10A provides an electrical decoupling of the active layer stack materials on one side of the trench and of the active layer stack material on the other side of the first trench. Thus the isolating body 10 in the first trenches provides an interruption of all layers in the active layer stack with full isolation between the two sides A, B of the first trench/isolating body 10.

On a first side A of the first insulating body 10 at some distance from it, the second trench 11A/isolating body 11 is created in the insulating layer 9 and the layer stack in a manner that the depth of the second trench extends into the photovoltaic active layer 7 below the top electrode layer 8, such that a portion of the photoactive layer below the second trench 11A and the bottom electrode layer 6 remains present or intact.

Thus the isolating body 11 in the second trench 11A is arranged to provide an interruption of the insulating layer 9 and the top electrode layer 8 in the layer stack, a partial interruption of the photo-active layer 7. The bottom electrode layer 6 is not affected by the second trench.

Finally, the first and second trenches 10A, 11A are each filled with an insulating material to form the first and second insulating bodies 10, 11, respectively.

The insulating bodies 10, 11 may be formed by inkjet printing, in which isolating inkjet is deposited in the first and second trenches. Alternatively, slot-die coating or spraying can be used.

Figure 3:
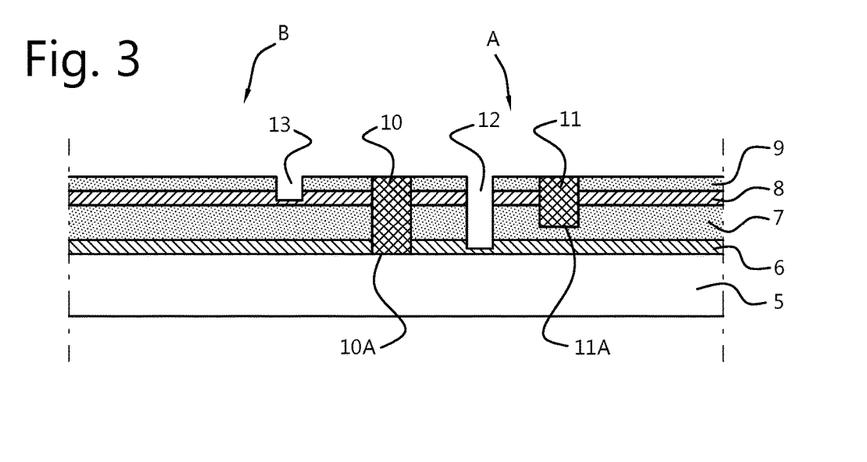
FIG. 3 shows a cross-section of the layer stack on a substrate according to a subsequent step of the process.

FIG. 3 shows a cross-section of the layer stack on a substrate according to a subsequent step of the process.

In a subsequent step, a third and fourth trench 12, 13 are created, preferably by a selective laser ablation process.

In a preferred embodiment, the third and fourth trenches 12, 13 are formed by a simultaneous laser scribing process.

Simultaneous laser scribing can be performed by creating the third and fourth trenches the same time by two individual laser beams positioned at a predetermined distance from each other.

The third trench is formed to have a depth that extends from the surface of the insulating layer 9 to, or into, the bottom electrode layer 6.

The third trench 12 is located between the first trench 10A holding the first isolating body 10 and the second trench 11A holding the second isolating body 11.

With respect to the position of the third trench 12, the fourth trench 13 is located on the opposite side B of the first trench.

The fourth trench 13 is formed to have a depth that extends from the surface of the insulating layer 9 to the top electrode layer 8, or into the top electrode layer 8.

Figure 4:
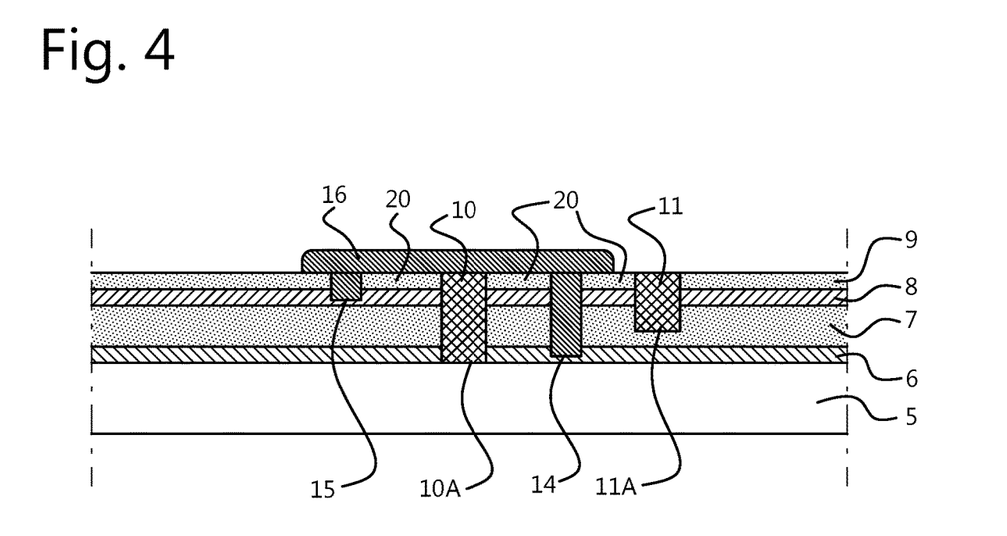
FIG. 4 shows a cross-section of the layer stack on a substrate according to a next step of the process.

FIG. 4 shows a cross-section of the layer stack on a substrate according to a next step of the process.

In this step of the process, the third and fourth trenches 12, 13 are filled with a conductive material by preferably an inkjet printing process. In the third trench 12 a first conductive body 14 is formed that contacts the bottom electrode layer 6. In the fourth trench 13 a second conductive body 15 is formed that contacts the top electrode layer 8.

Next, a bridge element 16 of conductive material is created by printing with conductive ink (ink-jetting), which bridge element forms a bridging connection between the first conductive body 14 and the second conductive body 15. The bridging element 16 extends laterally from the first conductive body 14 in the third trench 12 to the second conductive body 15 in the fourth trench 13 and crosses the first isolation body 10 in the first trench 10A. Further the bridging element 16 is isolated from the layer stack 6, 7, 8 by portions of the insulating layer 9.

The structure of these four scribes (first, second, third and fourth trenches 10A, 11A, 12, 13) that is created by the trench formation processes (laser ablations) is easier to print because the conductive connection is defined by the position of the first and second conductive bodies and not by inkjet or print line dimensions. As long as the inkjet or print line covers both the first and second conductive bodies there is an interconnection.

In an embodiment, to promote a self-alignment of the bridging element 16 as created by the ink, the isolating surface area 20 between the first and second conductive bodies can be modified locally for ink adhesion promotion and improved capillary flow of the ink.

The skilled in the art will appreciate that to minimize the dead zone i.e., a zone without or with reduced photo-activity, the first conductive body 14 is placed in a space with a distance between the first isolation body 10 and the second isolation body 11 that is arranged to be minimized.

Figure 5:
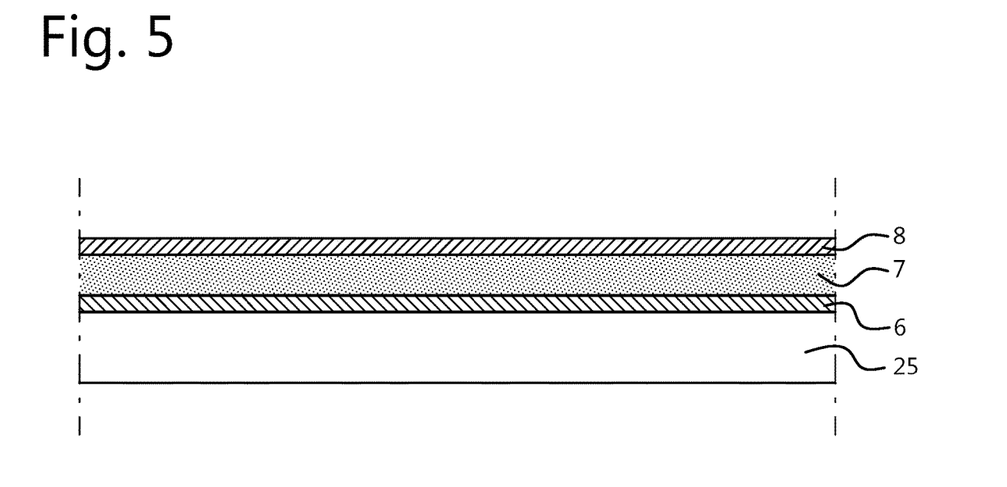
FIG. 5 shows a cross-section of a layer stack on a substrate in a step of a process for forming a thin film solar panel according to an embodiment of the invention.

FIG. 5 shows a cross-section of a layer stack on a substrate in a step of a process for forming a thin film solar panel according to an embodiment of the invention.

On a substrate 25, a stack of layers 6, 7, 8 is fabricated by deposition of the individual layers in a sequence.

On the substrate 25, first a bottom electrode layer 6 is created, by a suitable deposition or coating process.

Next on the bottom electrode layer 6, a photoactive layer 7 is formed. The photoactive layer 7 is covered by a top electrode layer 8.

The bottom electrode layer 6, the photo-active layer 7 and the top electrode layer 8 form an active layer stack 6, 7, 8 as explained with reference to FIG. 1.

Figure 6:
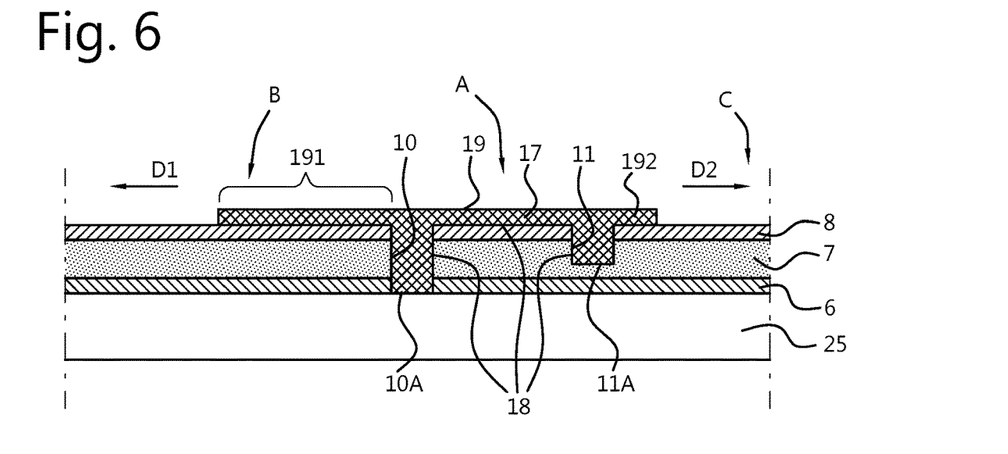
FIG. 6 shows a cross-section of the layer stack on a substrate according to a further step of the process.

FIG. 6 shows a cross-section of the layer stack on the substrate 25 according to a further step of the process.

In a further step, a pattern of first and second trenches 10, 11 are created in the active layer stack 6, 7, 8.

The isolation trenches 10A, 11A are typically formed by selective laser ablation process in which a pattern of first and second trenches 10A, 11A (scribes) are formed in the active layer stack 6, 7, 8.

The first and second trenches 10A, 11A are patterned in accordance with the contours of the photovoltaic cells that are to be formed in the layer stack.

The first trench 10A is formed to have a depth in the active layer stack 6, 7, 8 that extends to the surface of the substrate 25. In this manner the first trench 10A provides an electrical decoupling of the active layer stack materials on one side A of the first trench 10A and of the active layer stack material on the other side B of the first trench 10A. Thus the first trench 10A provides an interruption of all layers 6, 7, 8 in the active layer stack with full isolation between the two sides A, B of the first trench 10A.

On a first side A of the first trench 10A at some distance from it, the second trench 11A is created in the active layer stack in a manner that the depth of the second trench 11A extends into the photovoltaic active layer 7 below the top electrode layer 8, such that a portion of the photoactive layer below the second trench 11A and the bottom electrode layer 6 remains present or intact.

Next, a local isolating structure 17 is formed from an insulating material 18. The local isolating structure 17 is created above the first and second trenches 10A, 11A in a manner that the first and second trenches 10A, 11A are filled by the material of the local isolating structure 17. The local isolating structure 17 comprises a central layer portion 19 and two lateral extension parts 191, 192.

Between the first and second filled trenches 10A, 11A the central layer portion 19 of the local isolating structure 17 covers and connects the first and second filled trenches 10, 11 and two extension parts 191, 192.

A first extension part extends as first layer portion 191 laterally along a first portion of the top electrode layer 8 from the first trench in a first direction D1 which with respect to the position of the second trench is away from the second trench.

A second extension part extends as second layer portion 192 laterally along a second portion of the top electrode layer 8 from the second trench in a second direction D2 opposite the first direction D1 away from the first trench.

The local isolating body 17 can be created by (inkjet) printing using an insulating ink material. Alternative methods to form the local isolating body comprise slot-die coating and spraying.

The local isolating structure material 18 may be a (semi) transparent material or may be an opaque material. In the latter case, it will be appreciated that the surface area occupied by the layer portion of the local isolating structure is dimensioned so as to have a minimal dead zone or inactive area covered by the opaque material.

Figure 7:
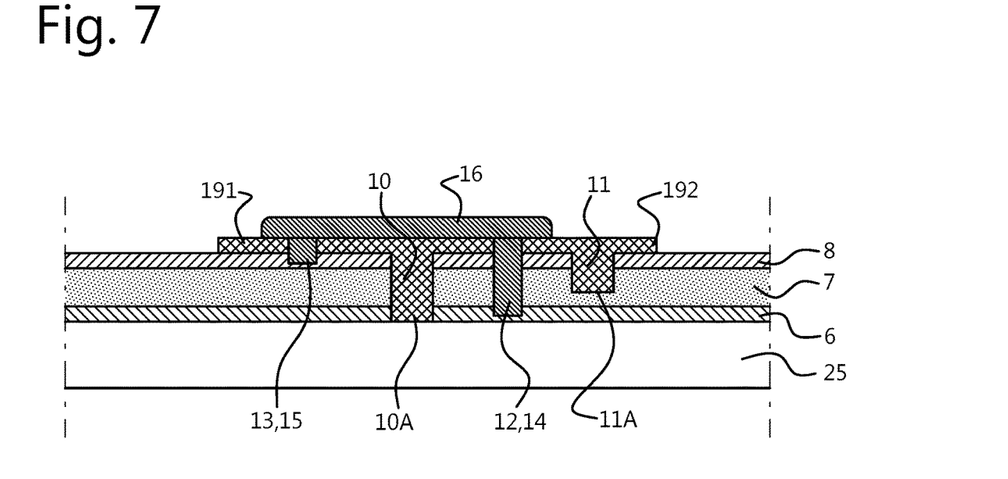
FIG. 7 shows a cross-section of the layer stack on a substrate according to a subsequent step of the process.

FIG. 7 shows a cross-section of the layer stack on a substrate according to a subsequent step of the process.

In a subsequent step, a connecting element 14, 15, 16 is formed on top of the local isolating structure.

First, a third and fourth trenches 12, 13 are created in the layer portion 19, 191, 192 of the local isolating structure and in the active layer stack 6, 7, 8, preferably by a selective laser ablation process.

The third trench 12 is formed to have a depth that extends from the top surface of the local isolating structure to, or into, the bottom electrode layer 6.

The third trench 12 is located between the first trench 10 holding the first isolating body 10 and the second trench 11 holding the second isolating body 11.

With respect to the position of the third trench 12 (at side A), the fourth trench 13 is located on the opposite side (side B) of the first trench 10.

The fourth trench 13 is formed to have a depth that extends from the surface of the local isolating structure to the top electrode layer 8, or into the top electrode layer.

Next, the third and fourth trenches 12, 13 are filled with a conductive material by preferably an inkjet printing process. In the third trench a first conductive body 14 is formed that contacts the bottom electrode layer 6. In the fourth trench 13 a second conductive body 15 is formed that contacts the top electrode layer 8.

In the same printing step, a bridge element 16 of conductive material is created by printing with conductive ink (ink-jetting). Alternatively, the bridge element is created in a separate subsequent step, which may involve (inkjet) printing, slot-die coating or spraying.

The bridge element 16 forms a bridging connection between the first conductive body 14 and the second conductive body 15. The bridging element 16 extends laterally from the first conductive body 14 in the third trench 12 to the second conductive body 15 in the fourth trench 13 and crosses the first isolation body 10 in the first trench 10A. Further the bridging element 16 is isolated from the layer stack by the layer portion 191, 19, 192 of the local isolating structure 17.

As shown in FIG. 7, the first conductive body 14 (i.e., the third trench 12) is positioned between the first and second isolating bodies 10, 11 (i.e., the first and trenches 10A, 11A), with intermediate portions of the active layer stack between the first conductive body 14 and the first isolating body 10 and between the first conductive body 14 and the second isolating body 11, respectively. These intermediate portions are substantially dead zones or inactive areas as will appreciated by the person skilled in the art. However, the dead zones or inactive area can be minimized as shown in FIG. 8.

Figure 8:
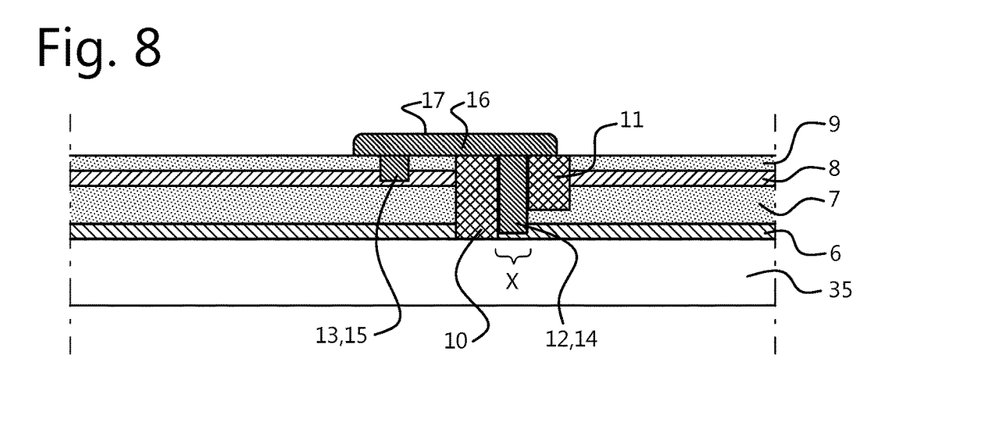
FIG. 8 shows a cross-section of the layer stack on a substrate according to a next step of the process.

FIG. 8 shows a cross-section of the layer stack on a substrate 35 according to an alternative embodiment. In this embodiment, a spacing X between the first and second trenches 10A, 11A (and first and second isolating bodies 10, 11), is minimized, such that the dimension of the spacing X corresponds with the dimension of the third trench 12 in the same direction. In this manner, the first conductive body 14 in the third trench 12 on a side borders on the first isolating body 10 in the first trench 10A and on another side borders on the second isolating body 11 in the second trench 11A.

Accordingly, the area occupied by the part of the interconnecting structure which comprises the first and second isolating bodies 10, 11 and the first conductive body 14, is reduced to a minimal footprint of the overall photo-active area.

Additionally, the position of the second conductive body 15 (i.e., the fourth trench 14) which is located, with respect to the position of the first conductive body 14, on an opposite side of the first isolating body 10, can be arranged in a manner that shading of the photo-active area by the bridge element 16 is optimally reduced. A length of the bridge element 16 from the first conductive body 14 to the second conductive body 15 can be designed accordingly.

With reference to the embodiment of FIGS. 5-8, the structure of these four scribes (first, second, third and fourth trenches) that is created by the trench formation processes (laser ablations) is easier to print because the conductive connection is defined by the position of the first and second conductive bodies and not by inkjet or print line dimensions. As long as the inkjet or print line covers both the first and second conductive bodies there is an interconnection.

Figure 9:
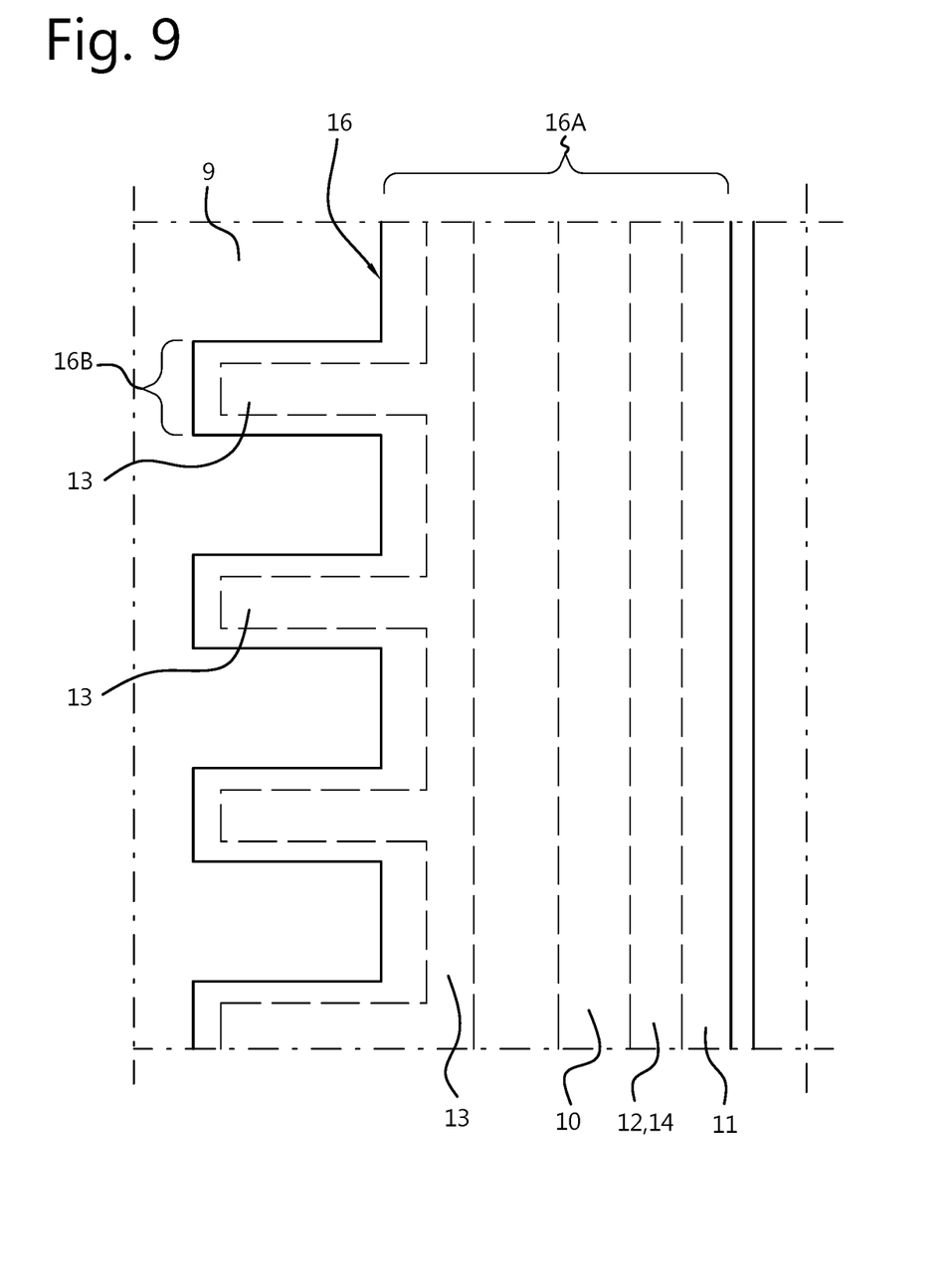
FIG. 9 shows a top view of the layer stack in accordance with an embodiment of the invention.

FIG. 9 shows a top view of a layer stack according to an embodiment of the invention. According to an embodiment, the bridge element 16 is arranged as a digitated structure comprising an elongated backbone 16a (i.e., substantially above first isolating body 10, first conductive body 14 and intermediate area between the first isolating body 10 and the first conductive body 14) and digits 16b to reinforce the electrode layer structure by locally connecting to the electrode layer through a via or a trench 13.

The digits 16b of the bridge element 16 extend over the insulating layer 9 or local insulating structure 19—on the side of the second conductive body 15 (and fourth trench 13), away from the first trench 10A.

The fourth trench 13 is arranged to have a digitated structure similar to the digitated bridge element 16 with a similar pitch between its digits and a similar length of its digits as the digits of the bridge element 16.

It is observed that the digitated bridge element 16 and a digitated second conductive body 15 can be formed with relative ease, by printing only a portion of the bridge element 16 with a conductive ink, i.e., the backbone portion 16a. The remaining portion of the digitated bridge element 16b and the digitated second conductive body 15 is formed by a flow of the conductive ink through the digits of the fourth trench 13 from the printed portion 16a to the remaining portion 16b.

In accordance with the method of the invention a thin film solar cell arrangement or panel can be manufactured. Such a thin film solar cell arrangement comprises a substrate and an array of thin film solar cells arranged on said substrate. Each thin film solar cell is a layered stack structure with a bottom electrode layer, a photovoltaic active layer, a top electrode layer and an insulating layer. The bottom electrode layer is arranged on the surface of the substrate, the photovoltaic active layer is arranged on the bottom electrode layer, the top electrode layer on the photovoltaic active layer, and the insulating layer is arranged on the top electrode layer. A first thin film solar cell and a second thin film solar cell that is adjacent to the first thin film solar cell in a first direction are separated from each other by a first trench and a second trench.

The second trench is parallel to the first trench at a first side of the first trench and at a first distance from the first trench. The first trench extends in the layered stack to the surface of the substrate and is filled with an insulating material. The second trench extends in the layer stack into the photovoltaic active layer below the top electrode layer and is also filled with insulating material. A third trench is located between the first and second trench and extends in the layered stack to the bottom electrode layer. The third trench is filled with conductive material. A fourth trench is located at a second side of the first trench, opposite to the first side and extends to the top electrode layer. Also the fourth trench is filled with conductive material. A bridging element of conductive material is arranged between a top of the third filled trench and a top of the fourth filled trench, in such a way that the bridge element crosses the first filled trench.

In an embodiment the thin film solar cell arrangement's substrate is selected from a group comprising a thermoplastic foil, a Polyethylene terephthalate (PET) foil or plate, a Polyethylene naphthalate (PEN) foil or plate, a glass substrate, a insulated metal plate or shell or layer, and a ceramic substrate.

In an embodiment, the photovoltaic active layer of the thin film solar cell arrangement is selected from a group comprising thin film silicon, Copper indium gallium (di)

selenide CIGS, Cadmium telluride CdTe, Organic PhotoVoltaic material OPV, and a Perovskite.

In an embodiment, at least one of the top electrode and the bottom electrode of the thin film solar panel comprises a transparent conductive oxide.

In an embodiment of the thin solar cell arrangement, a thickness of the transparent conductive oxide of at least one of the top electrode and bottom electrode is about 1 µm.

In an embodiment of the thin solar panel, a thickness of the insulating layer or local insulating layer is between about 100 nm and about 4 µm.

The invention has been described with reference to some specific embodiments. Obvious modifications and alterations will occur to others upon reading and understanding the preceding detailed description. It is intended that the invention be construed as including all such modifications and alterations insofar as they come within the scope of the appended claims.

The invention claimed is:

1. Method for manufacturing a thin film solar cell arrangement with an array of thin film solar cells, comprising:
   providing a substrate;
   creating a layer stack on a surface of the substrate, the layer stack comprising a bottom electrode layer, a photovoltaic active layer, and a top electrode layer,
   with the bottom electrode layer arranged on the surface of the substrate, the photovoltaic active layer arranged on the bottom electrode layer, the top electrode layer arranged on the photovoltaic active layer, and
   creating an insulating layer arranged on the top electrode layer;
   creating a first trench in the insulating layer and the layer stack that extends to the surface of the substrate;
   creating at a first side of the first trench, a second trench in the insulating layer and the layer stack which second trench extends into the photovoltaic active layer below the top electrode layer; the second trench being spaced apart from the first trench at a first distance in a first direction;
   filling the first and second trenches with an insulating material;
   creating a third trench in the insulating layer and the layer stack located between the first filled trench and the second filled trench, the third trench extending into the bottom electrode layer, in a manner that the bottom electrode layer is exposed;
   creating a fourth trench at second side, opposite to the first side, of the first trench, the fourth trench extending through the insulating layer into the top electrode layer, in a manner that the top electrode layer is exposed;
   filling the third and fourth trenches with a conductive material, and
   creating on top of the insulating layer a bridge element of conductive material between a top of the third filled trench and a top of the fourth filled trench, the bridge element crossing the first filled trench.

2. Method according to claim 1, wherein the creation of a first, second, third or fourth trench is performed by ablative laser scribing.

3. Method according to claim 1, wherein filling the first and second trenches with insulating material comprises printing an ink comprising the insulating material at the location of the first and second trenches and subsequently curing the printed ink.

4. Method according to claim 3, wherein the creation of the local insulating layer comprises the step of filling the first and second trenches with insulating material.

5. Method according to claim 1, wherein the created insulating layer or the created local insulating layer is substantially continuous and uninterrupted.

6. Method according to claim 1, wherein the filling of the third and fourth trenches comprises one filling step selected from:
   printing an ink comprising conductive material, slot dyeing a dye comprising conductive material and spraying an ink comprising conductive material,
   said selected filling step followed by a curing of the ink or dye.

7. Method according to claim 6, wherein the creation of the bridge element comprises one creation step selected from:
   printing an ink comprising conductive material, slot dyeing a dye comprising conductive material and spraying an ink comprising conductive material,
   said selected creation step followed by a curing of the ink or dye.

8. Method according claim 1, wherein the manufacturing is carried out in a roll-to-roll process.

9. Method according to claim 1, wherein the creation of the insulating layer is done by a deposition process or formation process configured for creation of a continuous and uninterrupted insulator layer.

10. Method according to claim 1, wherein the creation of the first trench and the second trench is done by a pair of parallel laser beam scribes.

11. Method according to claim 1, wherein the creation of the third trench and the fourth trench is done by a second pair of parallel laser beam scribes.

12. Method according to claim 1, wherein the fourth trench is configured to have a digitated structure with digits extending over the isolating layer or the local isolating structure away from the position of the first isolating body, and
   filling the digitated fourth trench to obtain a digitated second conductive body structure.

13. Method according to claim 12, wherein the bridge element has a digitated structure similar to the digitated structure of the fourth trenches or the second conductive body structure.

14. Thin film solar cell arrangement comprising a substrate and an array of thin film solar cells arranged on said substrate;
   each thin film solar cell being a layered stack structure comprising a bottom electrode layer, a photovoltaic active layer, a top electrode layer and an insulating layer,
   with the bottom electrode layer arranged on the surface of the substrate, the photovoltaic active layer arranged on the bottom electrode layer, the top electrode layer arranged on the photovoltaic active layer, and the insulating layer arranged on the top electrode layer,
   wherein a first thin film solar cell and a second thin film solar cell adjacent to the first thin film solar cell in a first direction are separated by a first trench and a second trench;
   the second trench being parallel to the first trench at a first side of the first trench and at a first distance from the first trench;
   the first trench extending in the layered stack to the surface of the substrate and filled with an insulating material;
   the second trench extending in the layer stack into the photovoltaic active layer below the top electrode layer and filled with insulating material;

a third trench being located between the first and second trench and extending in the layered stack to the bottom electrode layer, in a manner that the bottom electrode layer is exposed, the third trench being filled with conductive material;

a fourth trench being located at a second side of the first trench, opposite to the first side and extending through the insulating layer to the top electrode layer in a manner that the top electrode layer is exposed, the fourth trench being filled with conductive material, a bridging element of conductive material between a top of the third filled trench and a top of the fourth filled trench, a bridge element crossing the first filled trench, and wherein the filled fourth trench has a digitated structure with digits extending over the isolating layer or the local isolating structure away from the position of the first isolating trench, and the bridge element has a digitated structure covering the digitated structure of the filled fourth trenches.

15. Thin film solar cell arrangement according to claim 14, wherein the insulating layer is a local insulating layer that covers the first and second trenches and extends laterally along a portion of the top electrode layer in at least the first and a second direction opposite to the first direction.

16. Thin film solar cell arrangement according to claim 14, wherein:

the substrate is selected from a group comprising a thermoplastic foil, a Polyethylene terephthalate, PET, foil or plate, a Polyethylene naphthalate, PEN, foil or plate, a glass substrate, a metal substrate with an insulated surface layer, and a ceramic substrate.

17. Thin film solar cell arrangement according to claim 14, wherein the photovoltaic active layer is selected from a group comprising thin film silicon, Copper indium gallium (di)selenide CIGS, Cadmium telluride CdTe, Organic PhotoVoltaic material OPV, and a Perovskite.

18. Thin film solar cell arrangement according to claim 14, wherein at least one of the top electrode and the bottom electrode comprises a transparent conductive oxide.

19. Thin film solar cell arrangement according to claim 18, wherein a thickness of the transparent conductive oxide of the at least one of the top electrode and bottom electrode is about 1 μm.

20. Thin film solar cell arrangement according to claim 14, wherein a thickness of the insulating layer or local insulating layer in the layered stack structure is between about 100 nm and about 4 μm.

* * * * *